United States Patent
Chien et al.

(10) Patent No.: US 9,513,626 B2
(45) Date of Patent: Dec. 6, 2016

(54) METHOD OF DISPATCHING SEMICONDUCTOR BATCH PRODUCTION

(71) Applicant: National Tsing Hua University, Hsinchu (TW)

(72) Inventors: Chen-Fu Chien, Hsinchu (TW); Chia-Yu Hsu, Chung-Li (TW); Ying-Jen Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 451 days.

(21) Appl. No.: 14/146,251

(22) Filed: Jan. 2, 2014

(65) Prior Publication Data

US 2015/0066177 A1 Mar. 5, 2015

(30) Foreign Application Priority Data

Sep. 3, 2013 (TW) .............................. 102131637 A

(51) Int. Cl.
*H01L 21/02* (2006.01)
*G05B 19/418* (2006.01)
*H01L 21/66* (2006.01)

(52) U.S. Cl.
CPC ......... *G05B 19/41865* (2013.01); *H01L 22/12* (2013.01); *H01L 22/20* (2013.01); *G05B 2219/32324* (2013.01); *G05B 2219/45031* (2013.01); *Y02P 90/14* (2015.11); *Y02P 90/20* (2015.11)

(58) Field of Classification Search
CPC .............. G05B 19/41865; G05B 2219/45031; G05B 2219/32324; H01L 22/12; H01L 22/20; Y02P 90/14; Y02P 90/20
See application file for complete search history.

(56) References Cited

U.S. PATENT DOCUMENTS

| | | | | |
|---|---|---|---|---|
| 7,720,632 B2* | 5/2010 | Kurihara | ................. | H01L 22/12 250/310 |
| 7,816,062 B2* | 10/2010 | Nagatomo | .............. | H01L 22/12 250/492.3 |
| 8,150,140 B2* | 4/2012 | Kitamura | ................. | G06T 7/001 348/126 |
| 8,422,761 B2* | 4/2013 | Kitamura | .............. | G06T 7/0006 356/237.2 |
| 2010/0158345 A1* | 6/2010 | Kitamura | .............. | G06T 7/0006 382/145 |
| 2010/0215247 A1* | 8/2010 | Kitamura | ................ | G06T 7/001 382/149 |
| 2013/0114898 A1* | 5/2013 | Taguchi | ................. | G01B 11/00 382/170 |
| 2013/0326439 A1* | 12/2013 | Matsuoka | .............. | G01B 15/04 716/55 |

* cited by examiner

*Primary Examiner* — Charles Kasenge
(74) *Attorney, Agent, or Firm* — Muncy, Geissler, Olds & Lowe PC

(57) ABSTRACT

Disclosure is a method of dispatching semiconductor batch production, including: measuring an actual line width to calculate an estimated value of line width bias reference level, an estimated value of product bias, an estimated value of chamber bias and a standard error of chamber bias, and storing in a historical data module; inputting a product category, a line width measurement before manufacturing and a target line width after manufacturing in a batch production module; calculating a similarity index of each chambers by a computing engine of a matching module according to the data stored in the historical data module; transforming the similarity index into a priority of machine allocation by a dispatching module and dispatching a production machine; updating the historical data module by measuring a line width after manufacturing. The line width bias generated by various variations will be eliminated during the manufacturing process.

5 Claims, 6 Drawing Sheets

METHOD OF DISPATCHING SEMICONDUCTOR BATCH PRODUCTION

CROSS-REFERENCE TO RELATED APPLICATION

This application claims the benefit of Taiwan Patent Application No. 102131637, filed on Sep. 3, 2013, in the Taiwan Intellectual Property Office, the disclosure of which is incorporated herein its entirety by reference.

BACKGROUND OF THE INVENTION

1. Field of the Invention

The present invention generally relates to a method of dispatching semiconductor batch production, in particular with respect to a relationship between a line width bias of semiconductor product and machine, in order to eliminate the various variations during the manufacturing process.

2. Description of the Related Art

A line width is not only one of the important quality characteristics among the semiconductor elements, but also the significant index in the process thereof. The line width is generally defined as the smallest width of two patterns on a wafer, and with the more and more precision of semiconductor process being, if stacking a multi-layer structure on a tiny field or conducting numerous etching, even a slight bias generated by size and distance among the elements may easily be enlarged and cause deficiency, which not merely affects the schedule of the relevant manufacturing process, but also results in a great loss to the factory due to the semiconductor process such as etching process is unable to reproduce and the unqualified products have to scrap.

The general reason for causing line width bias lies in many possibilities. The present management of line width of semiconductor product mainly aims at adjusting the diversity of each machine, such as the setting of parameter of equipment for etching duration, gas flow, and electric quantity variation and so on; however, the arrangement often needs to be adjusted by experienced technician, and the adjusted machine does not fit into each batch productions, at the same time, engineering department cannot engage with manufacturing department due to the arrangement for setting the machine, so that the worker is incapable of proceeding to dispatch in accordance with the status of machine, and thus the line width bias of the products still continue to produce.

In view of the attribution, which may affect the line width, mainly includes product category, chamber, measuring machine, processing duration and relevant operation parameter of machine and so on. After gathering the historical data and conducting an analysis on the relevance, it can be found that the product category, the processing machine or the chamber have a higher relevance with the line width bias, consequently, in order to resolve the problem of causing a line width bias of semiconductor products, the variation of product category or reaction to machine are the most serious influences which needs to be embarked on.

As a result, a method of dispatching semiconductor batch production is provided to designate an adequate production machine by measuring the similarity of the line width bias between each batch productions and machines to overcome the aforementioned technical obstacle, so that to increase a higher production yield rate.

SUMMARY OF THE INVENTION

In view of the above technical problem, one of goals of the present invention is to provide a method of dispatching semiconductor batch production to overcome the obstacles to prior art with respect to a line width bias of semiconductor product generated by various variations during the manufacturing process.

In accordance with the aim of the present invention, a method of dispatching semiconductor batch production is provided, which is used to plan semiconductor batch production, comprises steps as follows: calculating an estimated value of line width bias reference level and an estimated value of product bias by measuring an actual line width after manufacturing, then calculating an estimated value of chamber bias and a standard error of chamber bias for a plurality of chambers, and storing which in a historical data module; inputting a batch production including a product category, a line width measurement before manufacturing and a target line width after manufacturing in a batch production module; combining the data of the batch production with which stored in the historical data module to calculate a similarity index of chamber between the batch production and each of the plurality of chambers by a computing engine of a matching module; transforming the similarity index of chamber into a priority of machine allocation by a dispatching module and dispatching a machine for the batch production according to the priority of machine allocation; and updating the data of the historical data module by measuring a line width measurement after manufacturing of the batch production in coordination with the product category of the batch production and the chamber used for manufacturing.

Preferably, the method of dispatching semiconductor batch production may further comprise steps as follows: calculating the similarity index of chamber of the batch production by a formula of $d_{ij}=(\beta_j-T_i)^2/se(\beta_j)$, wherein: $T_i=T_k-M_i-\mu-\alpha_k$; $d_{ij}$: the similarity index of chamber of chamber j in batch production i; $\beta_j$: the estimated value of chamber bias of chamber j; $se(\beta_j)$: the standard error of chamber bias of chamber j; $T_i$: the target value of batch production i; $T_k$: the target line width after manufacturing of product k; $M_i$: the line width measurement before manufacturing of batch production i; $\mu$: the estimated value of line width bias reference level; $\alpha_k$: the estimated value of product bias of product k.

Preferably, the method of dispatching semiconductor batch production may further comprise steps as follows: transforming the similarity index of chamber into a similarity index of machine by a dispatching rule to decide the priority of machine allocation and plan the machine used to manufacture the batch production, due to the machine includes the plurality of chambers.

Preferably, the dispatching rule may be a mini-max regret rule.

Preferably, the semiconductor batch production may comprise etching process or chemical-mechanical polishing (CMP) process.

To sum up, the method of dispatching semiconductor batch production in accordance with the present invention, there are one or more advantages as follows:

(1) the method of dispatching semiconductor batch production may designate the priority of machine allocation by a similarity index between the batch production and the chamber, and reduce the line width bias of semiconductor product by the mutual compensation between the dispatching machine and the batch production to increase the production yield rate.

(2) the method of dispatching semiconductor batch production is applicable to a machine having numerous chambers, and the influence generated by the machine or chamber upon the line width of semiconductor product may further reduce based on the assessment of individual characteristic of each chambers.

DETAILED DESCRIPTION OF THE PREFERRED EMBODIMENTS

Figure 1:
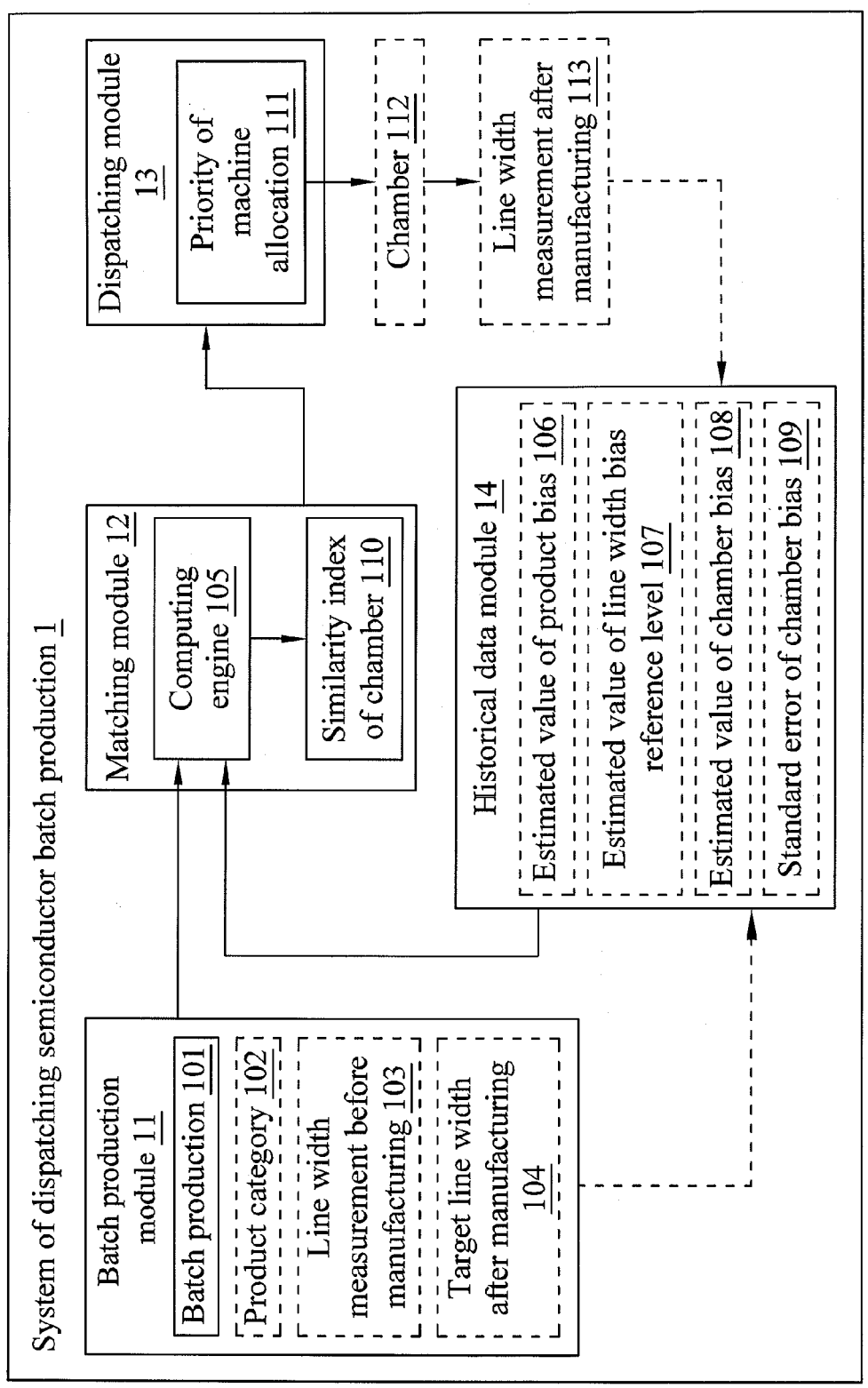
FIG. 1 is a block diagram of a system of dispatching semiconductor batch production of the present invention.

Hereinafter, embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

With reference to FIG. 1 for a block diagram of a system of dispatching semiconductor batch production. As shown in the figure, the system of dispatching semiconductor batch production 1 comprises a batch production module 11, a matching module 12, a dispatching module 13 and a historical data module 14. Wherein, the batch production module 11 comprises a plurality of data of batch production 101 including a product category 102, a line width measurement before manufacturing 103 and a target line width after manufacturing 104; the matching module comprises a computing engine 105, and the computing engine 105 individually calculates the similarity index of chamber 110 between each batch production 101 and the chamber according to the product category 102, the line width measurement before manufacturing 103 and the target line width after manufacturing 104 of each batch production 101 in the batch production module 11 in a coordination with information on an estimated value of product bias 106, an estimated value of line width bias reference level 107, an estimated value of chamber bias 108 and a standard error of chamber bias 109 stored in the historical data module 14; the dispatching module 13 generates a priority of machine allocation 111 according to a similarity index of chamber 110 between the batch production 101 and the chamber, and decides a chamber 112 used by the batch production 101 while producing according to the priority of machine allocation 111; the historical data module 14 stores the data of batch production 101 comprising the product category 102, the line width measurement before manufacturing 103 and the target line width after manufacturing 104 and records the used chamber 112 when the production is done and regularly measures a line width measurement after manufacturing 113 to update the information on the estimated value of product bias 106, the estimated value of line width bias reference level 107, the estimated value of chamber bias 108 and the standard error of chamber bias 109 in the historical data module 14, to provide the computing engine 105 with the information to calculate the similarity index of chamber 101 of next batch production 101.

Figure 2:
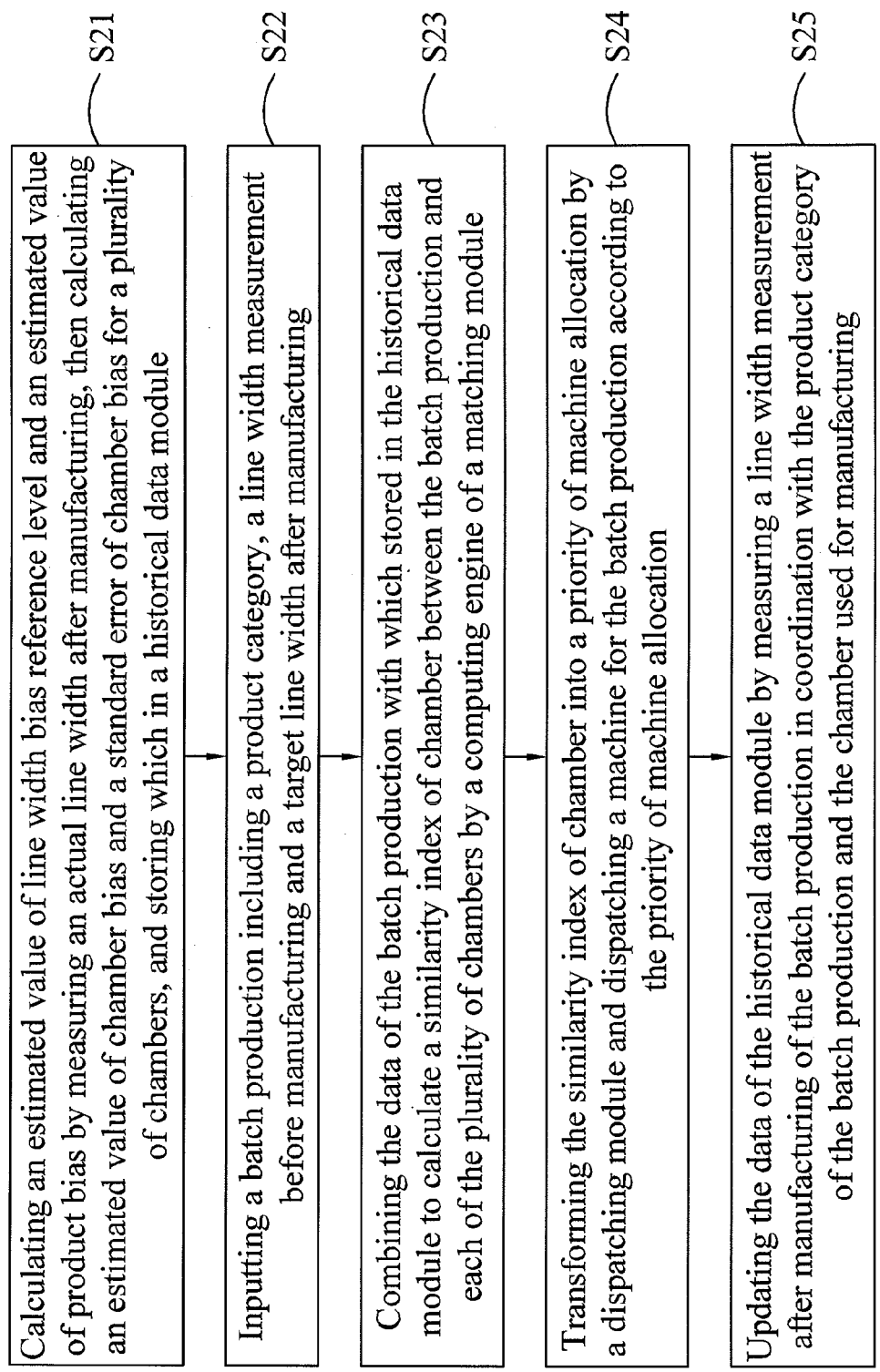
FIG. 2 is a flow chart of a method of dispatching semiconductor batch production of the present invention.

With reference to FIG. 2 for a flow chart of a method of dispatching semiconductor batch production of the present invention. The method of dispatching semiconductor batch production is applicable for planning semiconductor etching process or chemical-mechanical polishing process, wherein, the steps thereof comprising:

Step 21: calculating an estimated value of line width bias reference level and an estimated value of product bias by measuring an actual line width after manufacturing, then calculating an estimated value of chamber bias and a standard error of chamber bias for a plurality of chambers, and storing which in a historical data module.

Step 22: inputting a batch production including a product category, a line width measurement before manufacturing and a target line width after manufacturing.

Step 23: combining the data of the batch production with which stored in the historical data module to calculate a similarity index of chamber between the batch production and each of the plurality of chambers by a computing engine of a matching module.

Step 24: transforming the similarity index of chamber into a priority of machine allocation by a dispatching module and dispatching a machine for the batch production according to the priority of machine allocation.

Step 25: updating the data of the historical data module by measuring a line width measurement after manufacturing of the batch production in coordination with the product category of the batch production and the chamber used for manufacturing.

The above-mentioned steps belong to the batch production which is the desirable production input by planner, and calculating the similarity index of chamber between the batch production and each chambers by the computing engine, and the algorithm of the similarity index of chamber will be explained in the follow-up embodiments. Concerning about a manufacturing machine may comprise a plurality of chambers, a dispatching of a mini-max regret rule which may further be used to transform the similarity index of chamber into the similarity index of machine and further to decide the priority of machine allocation to plan the machine for batch production.

Figure 3:
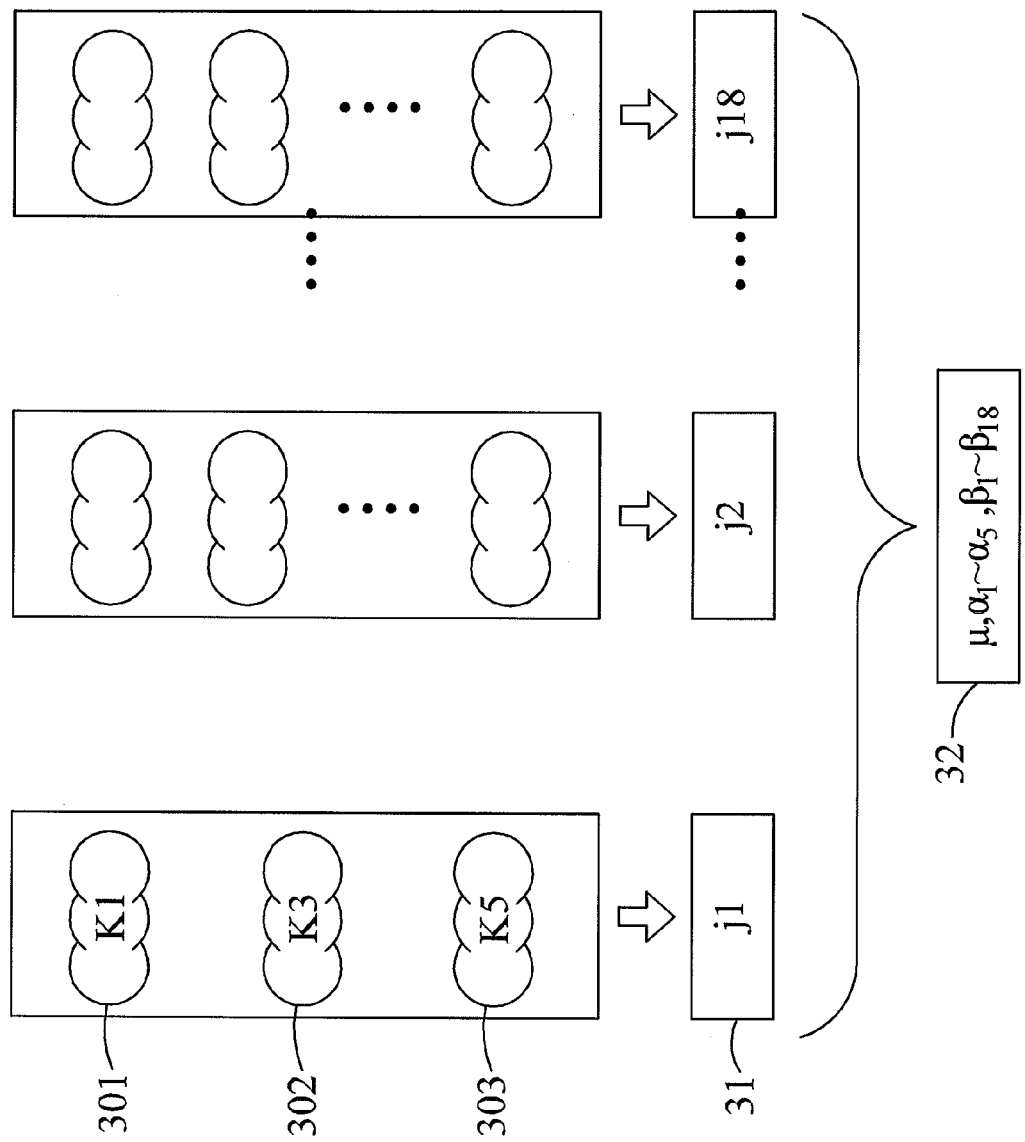
FIG. 3 is a schematic diagram of a method of dispatching semiconductor batch production in accordance with an embodiment of the present invention.

With reference to FIG. 3 for a schematic diagram of a method of dispatching semiconductor batch production in accordance with an embodiment of the present invention. As shown in the figure, according to the planning schedule, products in the first to third batch production 301-303 are conducted to each in the first etching reaction chamber 31, in which the production in the first to third batch production 301-303 belong to different product categories k1, k3 and k5, respectively, and the other batch productions are conducted in the rest of the chambers; wherein, the specific product is freely processed in particular chamber, so that each product and batch production may all be manufactured in different chambers. Recording the production statistics within two months of the factory and the measurement data related to the line width before and after etching process as the relevant data for building the historical data module 32. In the embodiment, there are 5 product categories, and the available etching chambers are 18, so recording the information on each batch production k1-k5 of the 5 product categories respectively generated in the 18 etching reaction chambers j1-j18, and measuring the line width measurement before and after etching, and individually counting the influences of different products and etching reaction chambers upon the line width bias after the etching process is done. In the calculation, the estimated value of product bias of the 5 products are $\alpha_1$-$\alpha_5$, the estimated value of line width bias reference level is $\mu$, the estimated values of chamber bias of the 18 chambers are $\beta_1$~$\beta_{18}$ and the corresponding standard errors of chamber bias are $se(\beta_1)$~$se(\beta_{18})$, and storing the calculated data in the historical data module 32.

According to the statement of the above embodiment, calculating the influence of each product and chamber upon the line width, wherein, the calculation of the estimated value of product bias of the 5 products are $\alpha_1$-$\alpha_5$ is to respectively count the etching biases of each product caused in all the different batch productions and all the different etching reaction chambers, and sampling the average rate as the estimated value; similarly, the calculation of the estimated values of chamber bias $\beta_1$~$\beta_{18}$ is to respectively count the bias values of all the batch productions and all the products of each chamber within the period, and sampling the average rate as the estimated value; finally, sampling the average value of all the line width measurement bias values as the estimated value of line width bias reference level $\mu$; in addition, calculating the standard error of the estimated value of the calculating object based on the gathered relevant statistics, and the obtained analysis thereof is stated as follows.

List 1:

| Reference level, Product category | μ | k1 | k2 | k3 | k4 | k5 |
|---|---|---|---|---|---|---|
| Estimated value ($\mu$, $\alpha_1$~$\alpha_5$) | 0.0138 | 0.0020 | 0.0048 | −0.0057 | 0.0035 | −0.0046 |
| Standard error | 0.0009 | 0.0010 | 0.0010 | 0.0011 | 0.0011 | 0.0010 |

| Chamber | j1 | j2 | j3 | j4 | j5 | j6 |
|---|---|---|---|---|---|---|
| Estimated value ($\beta_1$~$\beta_6$) | −0.0030 | 0.0001 | 0.0002 | −0.0028 | 0.0019 | 0.0015 |
| Standard error $se(\beta_1)$~$se(\beta_6)$ | 0.0014 | 0.0015 | 0.0015 | 0.0018 | 0.0022 | 0.0011 |

| Chamber | j7 | j8 | j9 | j10 | j11 | j12 |
|---|---|---|---|---|---|---|
| Estimated value ($\beta_7$~$\beta_{12}$) | −0.0007 | 0.0008 | −0.0063 | −0.0012 | 0.0017 | 0.0030 |
| Standard error $se(\beta_7)$~$se(\beta_{12})$ | 0.0009 | 0.0014 | 0.0011 | 0.0012 | 0.0012 | 0.0012 |

| Chamber | j13 | j14 | j15 | j16 | j17 | j18 |
|---|---|---|---|---|---|---|
| Estimated value ($\beta_{13}$~$\beta_{18}$) | −0.0003 | 0.0051 | 0.0031 | 0.0039 | 0.0008 | −0.0076 |
| Standard error $se(\beta_{13})$~$se(\beta_{18})$ | 0.0012 | 0.0010 | 0.0020 | 0.0012 | 0.0012 | 0.0014 |

As can be seen from the above list, if comparing the influence upon the estimated value with the standard error, taking the estimated value in excess of double as an obvious influence, all the product categories in the historical data module have a significant influence upon the etching bias, but of which 3 product categories k1, k2 and k4 have positive influence, the other 2 product categories k3 and k5 are with negative influence; and the data of chamber show that there are 6 chambers j1, j9, j12, j14, j16 and j18 with obvious influence, and positive and negative influence plays half-and-half. When a scheduling person is planning to dispatch, if the product with positive influence can be manufactured in the chamber with negative influence, the influence upon the line width caused by the both influences can therefore be eliminated, so that the product may be close to the target value after etching in the chamber.

By managing and analyzing the aforementioned historical data, the estimated value with different influence can be obtained, and by means of that to calculate the similarity index of chamber of the batch production and the matching level of each chamber according to the information on the desirable product category of the batch production and the line width measurement before manufacturing and the target line width after manufacturing in coordination with the influenced estimated value in the historical data, such as an estimated value of bias on product and machine, and the estimated value of line width bias reference level when planning a new batch production, and to plan the dispatching standard based on the similarity index to allocate the batch production to the well-matched chamber to conduct producing, so that to eliminate various variations, achieving the object value for the line width of product.

Figure 4:
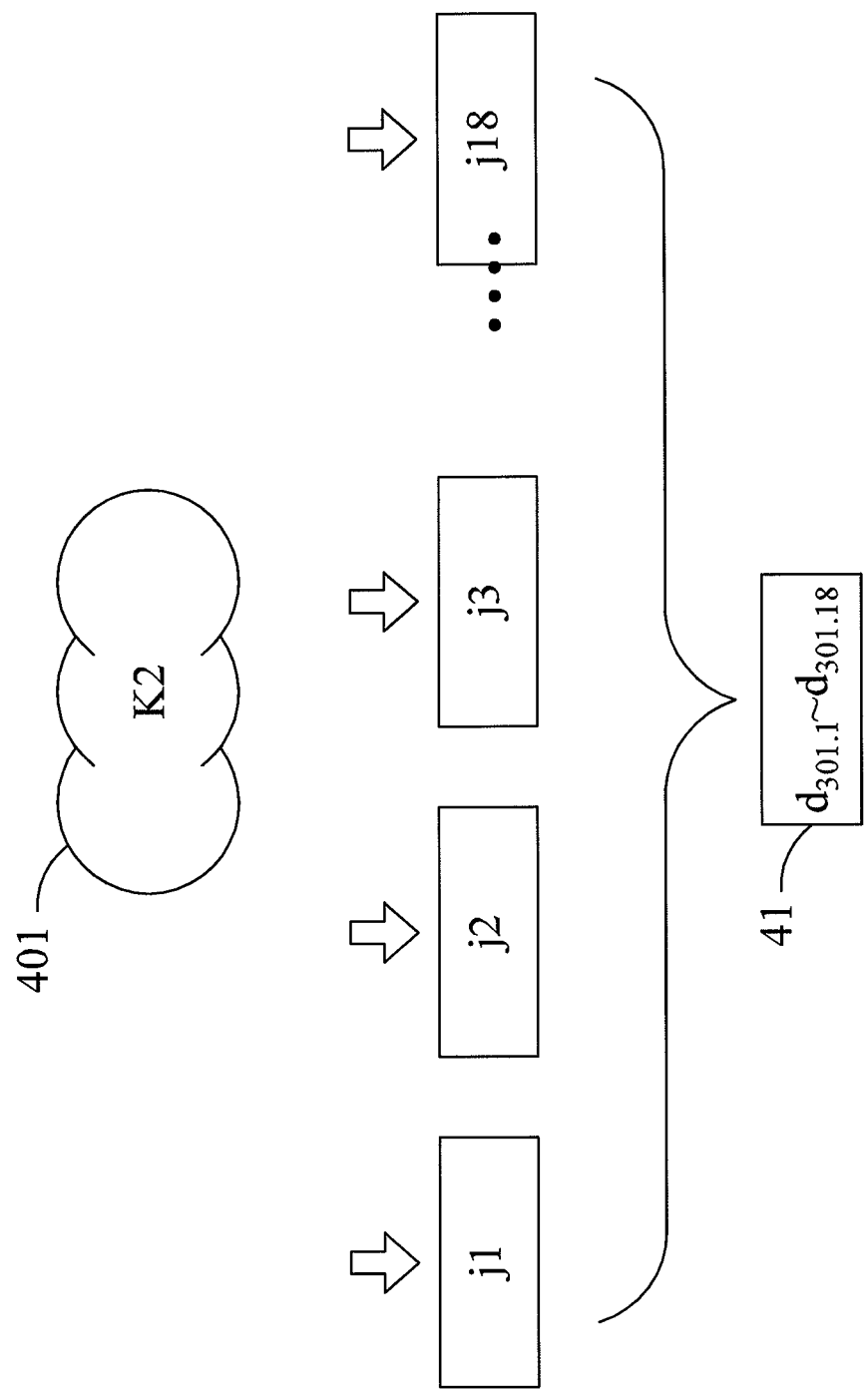
FIG. 4 is another schematic diagram of a method of dispatching semiconductor batch production in accordance with another embodiment of the present invention.

With reference to FIG. 4 for another schematic diagram of a method of dispatching semiconductor batch production in accordance with another embodiment of the present invention. As can be shown in the figure, a batch production 401 is desirable to conduct etching process, of which product category is k2, the line width measurement before manufacturing of the batch production 401 is 0.221 and the target line width after manufacturing is 0.24; the estimated value of line width bias reference level obtained from list 1 is 0.0138 and the estimated value of product bias of product k2 is 0.0048, to calculate according to the formula of $d_{ij}=(\beta_j-T_i)^2/se(\beta_j)$, wherein, the batch production 401 towards the target value of line width bias is: $T_{401}=T_{k2}-M_{301}-\mu-\alpha_{k2}=0.24-0.221-0.0138-0.0048=0.0004$, and respectively calculating the similarity index of chamber 41 of the batch production 401 and each chamber j1-j18, for example, the similarity of the third chamber is $d_{401,3}=(\beta_3-T_{401})^2/se(\beta_3)=(0.0002-0.0004)2/0.0015=0.00003$, the similarity index of rest of the chambers is $d_{401,j}$ which as the following list 2 shows. Comparing the size of the similarity index of chamber between the batch production 401 and the 18 chambers, of which $d_{401,3}$ in the third chamber j3 is the smallest; and thus, the priority of machine allocation of the batch production 401 is the biggest in the third chamber j3, so the priority of machine allocation for manufacturing the batch production 401 is the third chamber j3 when planning to dispatch.

production. However, when the batch production is conducting in reality, the machine is served as the dispatching unit according to the difference of machine or the process, consequently, the dispatching rule has to be further conducted transforming the priority of chamber allocation formed by the similarity index of chamber into the priority of machine allocation, and the judgment rule thereof may be a mini-max regret rule. Wherein, the mini-max regret approach conducts an aggregation by the similarity of chamber of different chamber in the same machine, the biggest similarity index of chamber is regarded as the similarity index of machine. Taking the similarity index of chamber on list 2 for example, if the first etching machine M1 has a first etching reaction chamber j1 and a second etching chamber j2, the similarity index of machine of the first machine M1 $d_{401,M1}$ is 0.00836, sorting out the similarity index of machine of the 9 etching machines M1-M9 and the 18 etching reaction chambers j1-j18 as shown in list 3 to decide the priority of machine allocation based on the similarity index of chamber; and as shown in list 3, the similarity index $d_{401,M3}$ of the third etching machine M3 is the smallest value, so the priority of machine allocation of the third etching machine M3 is the biggest; as a result, the priority of machine allocation for manufacturing the batch production is the third etching machine M3 when planning to dispatch.

List 3:

| Machine | M1(j1, j2) | M2(j3, j4) | M3(j5, j6) | M4(j7, j8) | M5(j9, j10) |
|---|---|---|---|---|---|
| Similarity ($d_{401,M}$) | 0.00836 | 0.00597 | 0.00109 | 0.00139 | 0.04162 |
| Priority of machine allocation | 5 | 4 | 1 | 2 | 8 |
| Chamber | M6(j11, j12) | M7(j13, j14) | M8(j15, j16) | M9(j17, j18) | |
| Similarity ($d_{401,M}$) | 0.00540 | 0.02115 | 0.00983 | 0.04534 | |
| Priority of machine allocation | 3 | 7 | 6 | 9 | |

List 2:

| Chamber | j1 | j2 | j3 | j4 | j5 | j6 |
|---|---|---|---|---|---|---|
| Similarity ($d_{401,j}$) | 0.00836 | 0.00005 | 0.00003 | 0.00597 | 0.00099 | 0.00109 |
| Chamber | j7 | j8 | j9 | j10 | j11 | j12 |
| Similarity ($d_{401,j}$) | 0.00139 | 0.00012 | 0.04162 | 0.00203 | 0.00143 | 0.00540 |
| Chamber | j13 | j14 | j15 | j16 | j17 | j18 |
| Similarity ($d_{401,j}$) | 0.00043 | 0.02115 | 0.00362 | 0.00983 | 0.00011 | 0.04534 |

Figure 5:
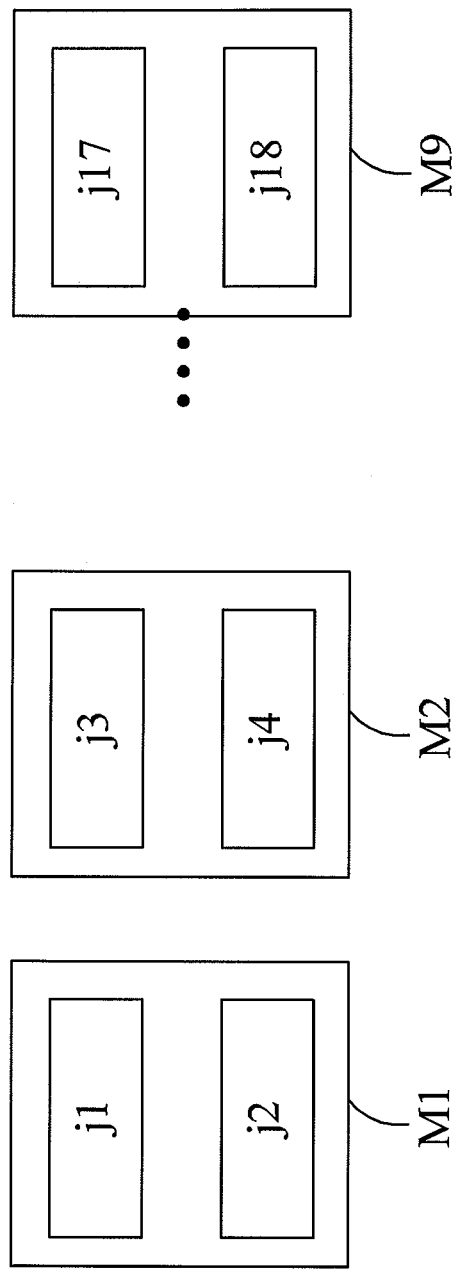
FIG. 5 is a schematic diagram of relationship between a machine and a chamber of dispatching semiconductor batch production of the present invention.

With reference to FIG. 5 for a schematic diagram of relationship between a machine and a chamber of dispatching semiconductor batch production of the present invention. As can be shown in the figure, the 18 etching reaction chambers j1-j18 for planning to dispatch are respectively disposed in 9 etching machines M1-M9, each of the etching machines includes two etching reaction chambers, for example the first etching machine M1 has a first etching reaction chamber j1 and a second etching reaction chamber j2, and the chamber is served as the calculation reference when the system of dispatching semiconductor batch production is calculating the similarity index of the batch If the above-mentioned dispatching rule of minimum regret approach is replaced by other judgment, such as an average rule, different result will cause when planning to dispatch. So, gathering a total of 116 data of batch production of 5 products, and conducting a hundred times simulation by the two kinds of judgment rules, respectively; and averaging the outcome thereof and calculating the process capacity $C_{pk}$ when dispatching towards different products by different dispatching rule, so that to further verify the diversity if the dispatching system does not conduct; wherein, $C_{pk}=\min\{(USL-X)/3s, (X-LSL)/3s$, in which USL is a specification upper bound of line width of a product after etching, LSL is the specification lower bound of line width of a product after etching, X and s are the average value and standard error of production data, respectively. Concerning about the experiment is conducted on a chamber of machine which has different access percentage; the validation result is stated as following list 4.

As can be shown in list 4, whether the average rule or the mini-max regret rule is conducted, it indicates that both means improve the status in process capacity index to which does not conduct dispatching rule, and comparing with the two dispatching rules, the average rule may have a better improved efficiency, but in the aspect of the variations between different products, it may have a bigger gap; to a certain degree, the result of product category k1 in situations 2 and 4 may be worse than the status; to the contrary, even though the improvement in the mini-max regret rule is less better than the average rule, it achieves a positive improvement in whole, so that it may be closer to the practical operation and the mini-max regret rule is therefore a better dispatching rule.

List 4

| Product | k1 | k2 | k3 | k4 | k5 | Whole |
|---|---|---|---|---|---|---|
| Batch | 26 | 25 | 22 | 16 | 27 | 116 |
| Status $C_{pk}$ | 1.6 | 0.97 | 1.97 | 1.01 | 2.1 | 1.05 |
| Situation 1 (0.54, 0.46) | | | Average rule | | | |
| Process capacity index $C_{pk}$ | 1.61 | 1.42 | 2.48 | 1.86 | 3.38 | 1.72 |
| (Improvement percentage) | (0.54) | (46.16) | (25.76) | (84.19) | (60.91) | (64.39) |
| | | | Mini-max regret approach | | | |
| Process capacity index $C_{pk}$ | 1.69 | 1.32 | 2.49 | 1.90 | 3.15 | 1.61 |
| (Improvement percentage) | (5.8) | (35.84) | (26.34) | (88.55) | (49.94) | (53.67) |
| Situation 2 (0.7, 0.3) | | | Average rule | | | |
| Process capacity index $C_{pk}$ | 1.53 | 1.47 | 2.51 | 1.78 | 3.47 | 1.76 |
| (Improvement percentage) | (−4.17) | (52.33) | (27.63) | (76.02) | (65.30) | (68.47) |
| | | | Mini-max regret approach | | | |
| Process capacity index $C_{pk}$ | 1.78 | 1.24 | 2.50 | 1.88 | 3.16 | 1.60 |
| (Improvement percentage) | (11.25) | (27.63) | (27.03) | (85.86) | (50.49) | (53.10) |
| Situation 3 (0.3, 0.7) | | | Average rule | | | |
| Process capacity index $C_{pk}$ | 1.69 | 1.44 | 2.42 | 1.97 | 3.17 | 1.64 |
| (Improvement percentage) | (5.81) | (48.34) | (23.17) | (95.47) | (51.01) | (56.38) |
| | | | Mini-max regret approach | | | |
| Process capacity index $C_{pk}$ | 1.69 | 1.49 | 2.44 | 2.00 | 3.20 | 1.64 |
| (Improvement percentage) | (5.79) | (54.23) | (23.76) | (98.21) | (52.23) | (56.19) |
| Situation 4 (0.9, 0.1) | | | Average rule | | | |
| Process capacity index $C_{pk}$ | 1.51 | 1.58 | 2.54 | 1.90 | 3.63 | 1.88 |
| (Improvement percentage) | (−5.65) | (62.91) | (28.95) | (88.82) | (72.97) | (79.63) |
| | | | Mini-max regret approach | | | |
| Process capacity index $C_{pk}$ | 1.97 | 1.15 | 2.56 | 1.87 | 3.13 | 1.61 |
| (Improvement percentage) | (22.93) | (19.09) | (29.79) | (84.94) | (49.07) | (54.14) |
| Situation 5 (0.1, 0.9) | | | Average rule | | | |
| Process capacity index $C_{pk}$ | 1.82 | 1.58 | 2.38 | 2.26 | 3.17 | 1.64 |
| (Improvement percentage) | (13.88) | (62.78) | (21.04) | (123.9) | (45.39) | (53.28) |
| | | | Mini-max regret approach | | | |
| Process capacity index $C_{pk}$ | 1.81 | 1.65 | 2.38 | 2.21 | 3.22 | 1.66 |
| (Improvement percentage) | (13.87) | (70.17) | (20.85) | (118.9) | (53.47) | (58.52) |

Figure 6:
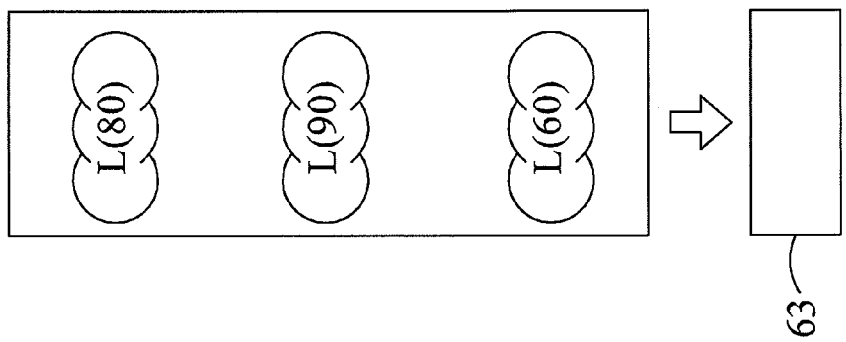
FIG. 6 is a schematic diagram of a method of dispatching semiconductor batch production in accordance with another embodiment of the present invention.
Figure 6:
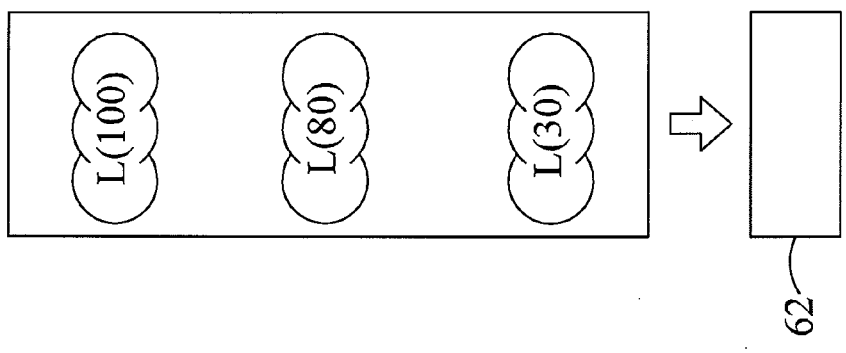
Figure 6:
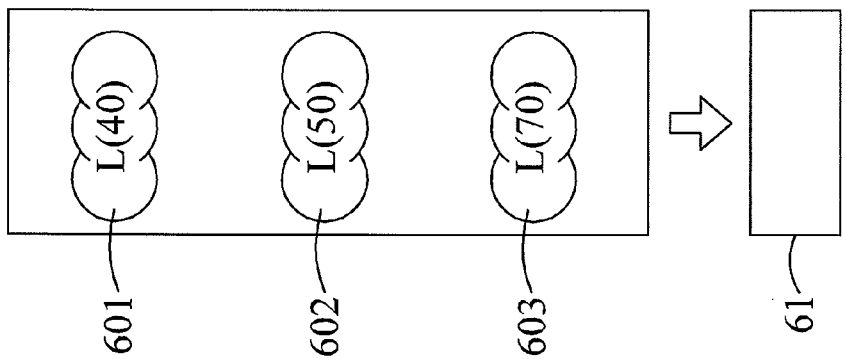

With reference to FIG. 6 for schematic diagram of a method of dispatching semiconductor batch production in accordance with another embodiment of the present invention. When a scheduling person is planning to dispatch, arrangement for numerous batch productions may be needed, for example planning the first to third batch production 601-603 to produce, and the dispatching module decides the priority of allocation for machines 61-63, the similarity index can be standardized to transform into point 0-100 as reference to the manufacturing department; as can be shown in the figure, the similarity standardized score of the first to third batch production 601-603 on the machine 61 are 40, 50 and 70, respectively, and thus, the priority of the third batch production 601 allocation is arranged to machine 61 for producing, hence, arranging the first batch production 601 to machine 62 for producing, and the second batch production 602 to machine 63; and in coordination with the habit of the user, can further clarify the dispatching standard by marking different colors, so that the manufacturing department can easily understand the plan to arrange the production. After manufacturing process, the estimated value of various variation in the storage module can be updated by means of the random inspection of the planned amount, measurement of the product line width and the information of batch production measurement; in addition, in the light of the measured result, calculation of the process capacity index $C_{pk}$ stated in the aforementioned embodiments can be made, and the result obtained by system of dispatching semiconductor batch production can not only be served as the index for improving the production efficiency of the verification system, but also the performance of planning or the personnel.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A method of dispatching semiconductor batch production, which is used to plan a semiconductor batch production, the method performing by a computing device with a memory and comprising steps as follows:

calculating an estimated value of line width bias reference level and an estimated value of product bias by measuring an actual line width after manufacturing, then calculating an estimated value of chamber bias and a standard error of chamber bias for a plurality of chambers, and storing which in a historical data module;

inputting a batch production including a product category, a line width measurement before manufacturing and a target line width after manufacturing in a batch production module;

combining the data of the batch production with which stored in the historical data module to calculate a similarity index of chamber between the batch production and each of the plurality of chambers by a computing engine of a matching module;

transforming the similarity index of chamber into a priority of machine allocation by a dispatching module and dispatching a machine for the batch production according to the priority of machine allocation; and updating the data of the historical data module by measuring a line width measurement after manufacturing of the batch production in coordination with the product category of the batch production and the chamber used for manufacturing.

2. The method of claim 1, further comprising steps as follows:

calculating the similarity index of chamber of the batch production by a formula of $d_{ij}=(\beta_j-T_i)2/se(\beta_j)$, wherein: $T_i=T_k-M_i-\mu-\alpha_k$;

$d_{ij}$: the similarity index of chamber of chamber j in batch production i;

$\beta_j$: the estimated value of chamber bias of chamber j;

$se(\beta_j)$: the standard error of chamber bias of chamber j;

$T_i$: the target value of batch production i;

$T_k$: the target line width after manufacturing of product k;

$M_i$: the line width measurement before manufacturing of batch production i;

$\mu$: the estimated value of line width bias reference level;

$\alpha_k$: the estimated value of product bias of product k.

3. The method of claim 1, further comprising steps as follows:

transforming the similarity index of chamber into a similarity index of machine by a dispatching rule to decide the priority of machine allocation and plan the machine used to manufacture the batch production.

4. The method of claim 3, wherein, the dispatching rule comprises a mini-max regret rule.

5. The method of claim 1, wherein, the semiconductor batch production comprises an etching process or a chemical-mechanical polishing (CMP) process.

\* \* \* \* \*